United States Patent
Matsuura et al.

(10) Patent No.: US 9,508,951 B2
(45) Date of Patent: Nov. 29, 2016

(54) ELECTRODE FOIL AND ORGANIC LIGHT-EMITTING DEVICE

(71) Applicants: Mitsui Mining & Smelting Co., Ltd., Tokyo (JP); Panasonic Corporation, Osaka (JP)

(72) Inventors: Yoshinori Matsuura, Kawagoe (JP); Toshimi Nakamura, Ageo (JP); Masaharu Myoi, Ageo (JP); Nozomu Kitajima, Omuta (JP); Mitsuo Yaguchi, Osaka (JP)

(73) Assignees: Mitsui Mining & Smelting Co., Ltd., Tokyo (JP); Panasonic Corporation, Osaka (JP)

( * ) Notice: Subject to any disclaimer, the term of this patent is extended or adjusted under 35 U.S.C. 154(b) by 10 days.

(21) Appl. No.: 14/414,983

(22) PCT Filed: Jun. 7, 2013

(86) PCT No.: PCT/JP2013/065824
§ 371 (c)(1),
(2) Date: Jan. 15, 2015

(87) PCT Pub. No.: WO2014/017183
PCT Pub. Date: Jan. 30, 2014

(65) Prior Publication Data
US 2015/0207096 A1    Jul. 23, 2015

(30) Foreign Application Priority Data
Jul. 24, 2012 (JP) ................. 2012-164025

(51) Int. Cl.
*H01L 51/52* (2006.01)
*H01L 51/00* (2006.01)

(52) U.S. Cl.
CPC ....... *H01L 51/5218* (2013.01); *H01L 51/5221* (2013.01); *H01L 51/0036* (2013.01); *H01L 51/0037* (2013.01); *H01L 51/0038* (2013.01); *H01L 51/5271* (2013.01); *H01L 2251/558* (2013.01); *Y10T 428/24355* (2015.01); *Y10T 428/31678* (2015.04)

(58) Field of Classification Search
CPC .................................................... H01L 51/5218
USPC .............................................................. 257/40
See application file for complete search history.

(56) References Cited

U.S. PATENT DOCUMENTS

2013/0069042 A1* 3/2013 Matsuura ............ H01L 51/5218
257/40

FOREIGN PATENT DOCUMENTS

JP        8158074 A    6/1996
JP     2008243772 A   10/2008

(Continued)

*Primary Examiner* — Dale E Page
*Assistant Examiner* — Damian A Hillman
(74) *Attorney, Agent, or Firm* — The Webb Law Firm (57) ABSTRACT

There is provided an electrode foil that can form an organic electroluminescent device having a high external quantum efficiency despite the presence of the organic nitrogen compound at the interface of a metal foil and a reflective layer. The electrode foil of the invention includes a metal foil made of copper or copper alloy and a reflective layer provided on at least one surface of the metal foil. The electrode foil has an organic nitrogen compound at the interface between the metal foil and the reflective layer in such an amount that the ratio of the number of counts on the C—N bond to the total number of counts on the copper and the C—N bond: CN/(CN+Cu) in the organic nitrogen compound is 0.4 or less determined by time-of-flight secondary ion mass spectrometric analysis (TOF-SIMS) of the interface.

11 Claims, 4 Drawing Sheets

(56) References Cited

FOREIGN PATENT DOCUMENTS

| | | | | | |
|---|---|---|---|---|---|
| JP | 2009152113 A | 7/2009 | | | |
| JP | WO 2010086893 A1 * | 8/2010 | ............ | C11D 7/265 | |
| JP | WO 2011152091 A1 * | 12/2011 | ......... | H01L 51/5218 | |
| WO | 2010086893 A1 | 8/2010 | | | |
| WO | 2011152091 A1 | 12/2011 | | | |
| WO | 2011152092 A1 | 12/2011 | | | |

* cited by examiner

FIG. 6 and claims priority to Japanese Patent Application No. 2012-164025 filed Jul. 24, 2012, the disclosures of which are hereby incorporated in their entirety by reference.

ELECTRODE FOIL AND ORGANIC LIGHT-EMITTING DEVICE

CROSS-REFERENCE TO RELATED APPLICATIONS

This application is the U.S. national phase of International Application No. PCT/JP2013/065824 filed Jun. 7, 2013, and claims priority to Japanese Patent Application No. 2012-164025 filed Jul. 24, 2012, the disclosures of which are hereby incorporated in their entirety by reference.

TECHNICAL FIELD

The present invention relates to an electrode foil including a metal foil and an organic electroluminescent device including the electrode foil.

BACKGROUND ART

Organic electroluminescent devices such as organic EL lighting devices have recently attracted attention as eco-friendly green devices. The organic EL lighting devices are characterized by 1) lower power consumption than incandescent lamps; 2) thin profile and light weight; and 3) flexibility. The organic EL lighting devices are now being developed to achieve the features 2) and 3). In this respect, glass substrates conventionally used in flat panel displays (FPD) or the like cannot achieve the features 2) and 3).

In this regard, researches have been conducted on a substrate as a support (hereinafter, referred to as "supporting substrate") for organic EL lighting devices, and ultra-thin glass plates, resin films, and metal foils have been proposed as candidate supporting substrates. The ultra-thin glass is superior in heat resistance, barrier performance, and optical transparency and has good flexibility, but is somewhat inferior in handling and has low thermal conductivity and high material cost. The resin film is superior in handling and flexibility and has low material cost and good optical transparency, but is inferior in heat resistance and barrier performance and has low thermal conductivity.

In contrast, the metal foil has excellent characteristics such as superior heat resistance, barrier performance, handling, and thermal conductivity, good flexibility, and low material cost, except for absence of optical transparency. In particular, a typical flexible glass or film has a significantly low thermal conductivity of 1 W/m° C. or lower, while a copper foil has a significantly high thermal conductivity of about 400 W/m° C.

Techniques for corrosion protection of metal foil used in electronic materials are known which involves application of organic nitrogen compounds on the metal foil for preventing surface oxidation and/or hydroxylation (e.g., refer to Patent Document 1: JPH08-158074A).

Patent Document 2 (JP2009-152113A) discloses formation of an organic layer on a surface of a metal substrate that is smoothed by polishing and/or plating, in order to achieve a light-emitting device including the metal substrate. Patent Document 3 (JP2008-243772A) discloses formation of an organic EL device on a smooth surface of a nickel plating layer that is formed on a metal substrate without polishing. In these techniques, however, the smoothing of the metal substrate is an important challenge for prevention of a short circuit between the electrodes. For addressing this challenge, Patent Document 4 (WO2011/152091) and Patent Document 5 (WO2011/152092) disclose metal foil having an ultra-smooth surface having an extremely low arithmetic mean roughness Ra of 10.0 nm or less that functions as both supporting substrates and electrodes. Such techniques have been established for forming an organic semiconductor layer directly on a metal foil electrode, enabling emission of light. Unfortunately this can achieve only about 80% of external quantum efficiency compared to an electrode formed on a glass substrate and therefore further improved luminous efficiency is desired.

CITATION LIST

Patent Documents

Patent Document 1: JPH08-158074A
Patent Document 2: JP2009-152113A
Patent Document 3: JP2008-243772A
Patent Document 4: WO2011/152091
Patent Document 5: WO2011/152092

SUMMARY OF INVENTION

The inventors have found that limiting the amount of an organic nitrogen compound present at the interface of a metal foil and a reflective layer in an electrode foil to a specific range significantly enhances external quantum efficiency of the organic electroluminescent device including the electrode foil, thereby increasing luminous efficiency.

Accordingly, it is an object of the present invention to provide an electrode foil that can form an organic electroluminescent device having a high external quantum efficiency despite the presence of the organic nitrogen compound at the interface of a metal foil and a reflective layer.

According to an aspect of the present invention, there is provided an electrode foil, wherein the electrode foil includes a metal foil made of copper or copper alloy and a reflective layer provided on at least one surface of the metal foil; and wherein an organic nitrogen compound is present at the interface between the metal foil and the reflective layer in such an amount that the ratio of the number of counts on the C—N bond to the total number of counts on the copper and the C—N bond: CN/(CN+Cu) in the organic nitrogen compound is 0.4 or less determined by time-of-flight secondary ion mass spectrometric analysis (TOF-SIMS) of the interface.

According to another aspect of the present invention, there is provided an organic electroluminescent device including the electrode foil and an organic emission layer provided on an outermost surface adjacent to the reflective layer of the electrode foil.

DESCRIPTION OF EMBODIMENT

Electrode Foil

Figure 1:
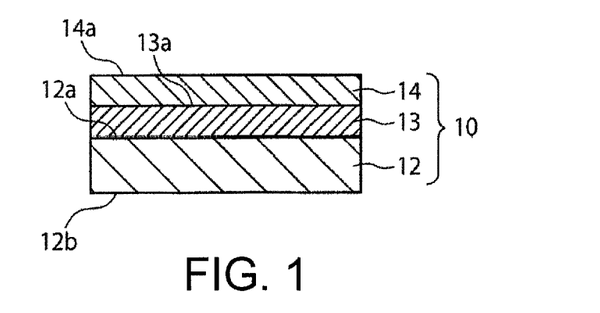
FIG. 1 is a schematic cross-sectional view illustrating an example of an electrode foil of the present invention.

FIG. 1 shows a schematic cross-sectional view of an example of an electrode foil of the present invention. The electrode foil 10 depicted in FIG. 1 includes a metal foil 12 made of copper or copper alloy, a reflective layer 13 provided on at least one surface of the metal foil, and an optional buffer layer 14 provided directly on the surface of the reflective layer. Thus, the electrode foil 10 has a triple-layer structure composed of the metal foil 12, the reflective layer 13, and the buffer layer 14, but the electrode foil of the present invention may have any multi-layer structure such as a double-layer structure composed of the metal foil 12 and the reflective layer 13. In a typical embodiment of the present invention, the reflective layer 13 is provided directly on at least one side of the metal foil 12. Alternatively, one or more other layers can be present between the metal foil 12 and the reflective layer 13 unless such a layer or layers impairs the intended function of the electrode foil 10. For example, the reflective layer 13 can be present on one or more metal layers formed on the metal foil.

An organic nitrogen compound is present at the interface between the metal foil 12 and the reflective layer 13. Organic nitrogen compounds are typically, but not limited to, those used as corrosion inhibitors for metal foil. Such organic nitrogen compounds (typically corrosion inhibitors) have been applied on metal foils for electric material to prevent surface oxidation and/or hydroxylation. Organic nitrogen compounds in the present invention are preferably selected from triazoles, and derivatives and isomers thereof, more preferably at least one compound selected from the group consisting of benzotriazole (BTA), benzotriazole derivatives, aminotriazole, aminotriazole isomers, and aminotriazole derivatives. Preferred examples of benzotriazole derivatives include heat-resistant carboxybenzotriazole, tolyltriazole (TTA), carboxybenzotriazole (C-BTA), sodium salts of tolyltriazole, and salts of tolyltriazole with various amines, such as monoethanolamine, cyclohexylamine, diisopropylamine and morpholine. Preferred examples of the aminotriazole isomers include 3-amino-1,2,4-triazole, 2-amino-1,3,4-triazole, 4-amino-1,2,4-triazole, and 1-amino-1,3,4-triazole. Preferred examples of the aminotriazole derivatives include sodium salt of aminotriazole and salts of aminotriazole with various amines such as monoethanolamine, cyclohexylamine, diisopropylamine and morpholine. If any other layer is present between the metal foil 12 and the reflective layer 13, "the interface between the metal foil 12 and the reflective layer 13" is intended to refer to the interface between the metal foil 12 and the other layer.

In the electrode foil 10 of the present invention, organic nitrogen compounds should be in such an amount that the ratio of the number of counts of the C—N bond to the total number of counts on the copper and the C—N bond: CN/(CN+Cu) in the organic nitrogen compound is 0.4 or less, preferably 0.3 or less, more preferably 0.2 or less, still more preferably 0.1 or less, most preferably 0.05 or less determined by time-of-flight secondary ion mass spectrometric analysis (TOF-SIMS) of the interface between the metal foil 12 and the reflective layer 13. The CN/(CN+Cu) ratio is an objective index for evaluating the residual amount of organic nitrogen compounds. Specifically, the interfacial analysis by time-of-flight secondary ion mass spectrometry (TOF-SIMS) requires sputtering from the side of the reflective layer along the depth of the metal foil to expose the interface precisely. The C—N bond present in the organic nitrogen compounds remains without decomposition during the analysis and is detectable directly, so that the CN/(CN+Cu) ratio can be an objective index for determining the levels of the organic nitrogen compounds. Even if the electrode foil is incorporated in an organic electroluminescent device, the organic layer on the electrode foil can be removed with organic solvent such as acetone or isopropyl alcohol (IPA) to make the measurement by sputtering along the depth in the TOF-SIMS apparatus.

Figure 2:
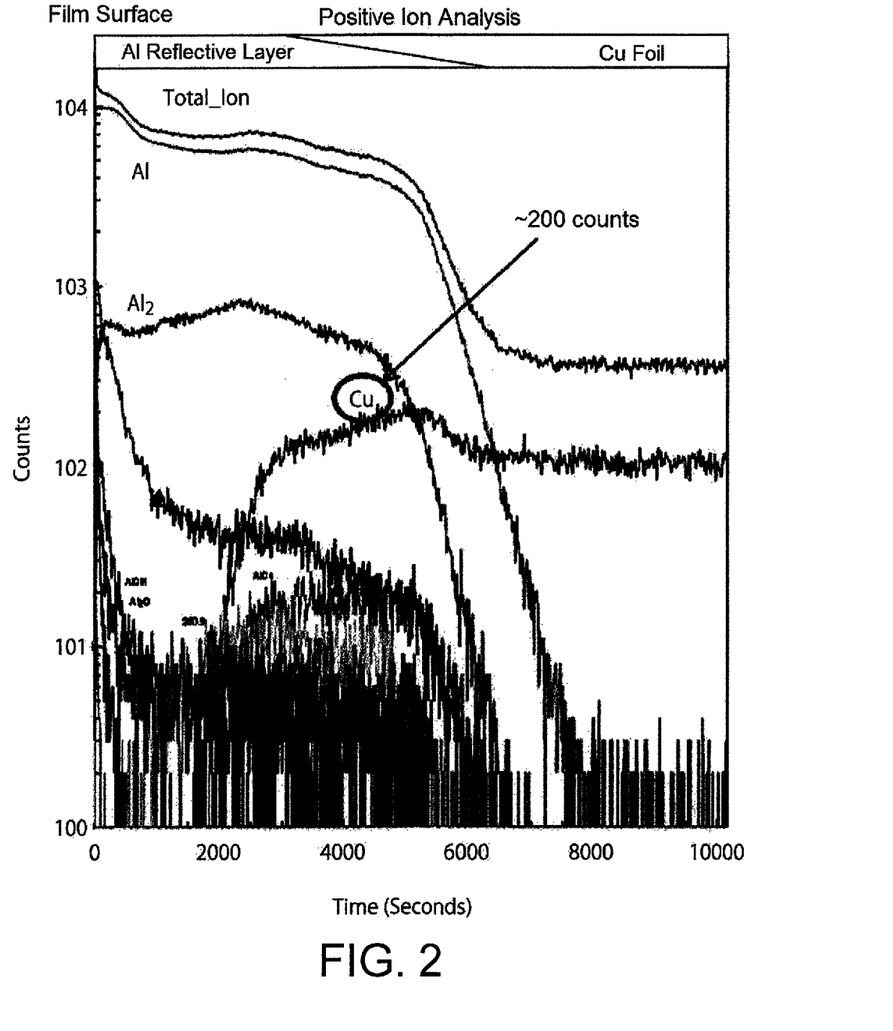
FIG. 2 is a chart illustrating an example of the results of positive ion analysis in time-of-flight secondary ion mass spectrometry (TOF-SIMS).
Figure 3:
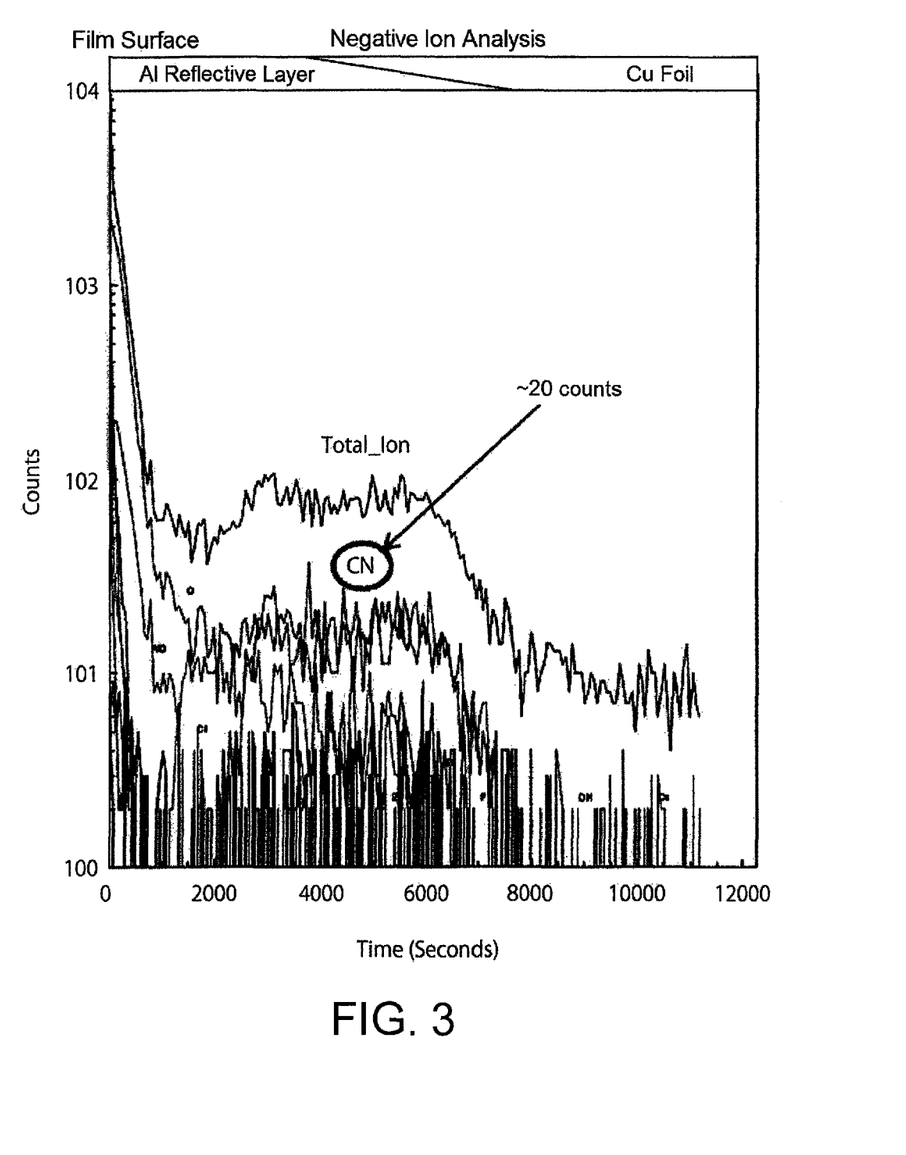
FIG. 3 is a chart illustrating an example of the results of negative ion analysis in time-of-flight secondary ion mass spectrometry (TOF-SIMS).

In TOF-SIMS, the number of counts of Cu at a point determined to be the interface in the positive ion analysis as shown in FIG. 2 (about 200 counts in FIG. 2) and the number of counts of C—N bond at a point determined to be the interface in negative ion analysis as shown in FIG. 3 (about 20 counts in FIG. 3) can be used to calculate the CN/(CN+Cu) ratio (20/(200+20)=0.09 in FIGS. 2 and 3). Thus, the relatively small number of counts of the C—N bond indicates that the residual level of organic nitrogen compounds is small. At a residual level less than a given level of organic nitrogen compounds, the external quantum efficiency of the organic electroluminescent device is unexpectedly significantly enhanced, resulting in increased luminous efficiency. Specifically, an external quantum efficiency equal to or greater than that of the electrode on a glass substrate can be achieved. The lower limit of the CN/(CN+Cu) ratio should not be limited, and preferably be at least 0.001 at which the organic nitrogen compound still has advantageous effects (typically anticorrosive effect). The absence of any organic nitrogen compound facilitates the formation of oxides and/or hydroxides on the metal foil surface, and these compounds may not only weaken the adhesion with the reflective layer, but also act as a resistance layer inhibiting the function of the electrode.

In the present invention, use of the metal foil 12 as a supporting substrate and an electrode can provide an electrode foil which functions as a supporting substrate, an electrode and a reflective layer. Furthermore, the use of the metal foil 12, instead of a metal plate, having a thickness of 1 to 250 µm can provide an electrode functioning as a supporting substrate for a flexible electronic device. In production of such a flexible electronic device, the electrode foil 12 of the present invention can be manufactured efficiently, for example, by a roll-to-roll process without a particular supporting substrate because the electrode foil 12 is based on a metal foil. The roll-to-roll process is a significantly advantageous process in terms of efficient mass production of electronic devices, in which a long foil is wound off a roll, subjected to a predetermined process and rewound; therefore the roll-to-roll process is a key process to achieve mass production of electronic devices such as a light-emitting element and a photoelectric element, which belong to the application field of the present invention. Thus, the electrode foil of the present invention does not require a supporting substrate and a reflecting layer. The electrode foil of the present invention, therefore, has no insulating layers preferably at least on a portion where the electronic device is to be disposed, and more preferably on any portion.

The metal foil 12 is a foil made of copper or copper alloy. Copper foil or copper alloy foil is excellent in strength, flexibility, and electrical properties while being relatively inexpensive. Furthermore, copper is a nonmagnetic metal, and therefore can prevent magnetic attraction of particles produced during machining.

The outermost surface adjacent to the reflective layer of the electrode foil 10 is an ultra-smooth surface having an arithmetic mean roughness Ra of 60.0 nm or less, preferably 30.0 nm or less, more preferably 20.0 nm or less, still more preferably 10.0 nm or less, specially preferably 7.0 nm or less, and the appropriate roughness can be determined according to the applications or characteristics required for the electrode foil. The arithmetic mean roughness Ra may have any lower limit; it may be 0 (zero), or 0.5 nm in view of the efficiency of surface smoothing treatment. The arithmetic mean roughness Ra can be measured in accordance with JIS B 0601-2001 with a commercially available surface roughness meter.

As described above, the expression "the outermost surface adjacent to the reflective layer of the electrode foil 10" refers to the surface of the reflective layer 13 or the buffer layer 14 which is located outermost. In the case of such a multi-layer structure, the targeted arithmetic roughness Ra can be achieved by forming the reflective layer 13 and optionally the buffer layer 14 on the surface 12a of the metal foil 12 which has an arithmetic mean roughness Ra in a range similar to those mentioned above, namely, 60.0 nm or less, preferably 30.0 nm or less, more preferably 20.0 nm or less, still more preferably 10.0 nm or less, particularly preferably 7.0 nm or less, and most preferably 5.0 nm or less. Thus, it is preferred that the surface of a layer or foil underneath the outermost surface has an arithmetic mean roughness Ra equivalent to or slightly smaller than a targeted arithmetic mean roughness Ra of the outermost surface. The arithmetic mean roughness Ra of the metal foil surface not constituting the outermost surface in the laminate may be evaluated by forming a cross section from the metal foil surface by a focused ion beam (FIB) process; and observing the cross section with a transmission electron microscope (TEM). The arithmetic mean roughness Ra of the reflective layer surface not constituting the outermost surface in the laminate may be evaluated in the same way.

The ultra-smooth surface 12a of the metal foil 12 can be achieved by polishing the metal foil 12 by electrolytic polishing, buff polishing, chemical polishing, physical-chemical polishing or a combination thereof. The chemical polishing can be carried out without particular limitation under appropriately controlled conditions, for example, the type of a chemical polishing solution, the temperature of the chemical polishing solution, and the dipping time in the chemical polishing solution. For example, a mixture of 2-aminoethanol and ammonium chloride can be used for chemical polishing of copper foil. The temperature of the chemical polishing solution is preferably room temperature, and a dipping method (Dip process) is preferably used. Furthermore, the preferred dipping time in the chemical polishing solution ranges from 10 to 120 seconds, more preferably from 30 to 90 seconds since long dipping time often results in loss of the smoothness. The metal foil after chemical polishing is preferred to be washed with running water. Such smoothing treatment can smooth the surface from an original arithmetic mean roughness Ra of about 12 nm to an Ra of 10.0 nm or less, for example, about 3.0 nm.

The ultra-smooth surface 12a can also be achieved by polishing the surface of the metal foil 12 through blasting; or melting the surface of the metal foil 12 through a technique such as laser heating, resistance heating, or lamp heating and then rapid quenching.

The metal foil 12 may have any thickness which allows the metal foil to retain sufficient flexibility and be handled alone as a foil. The thickness of the metal foil 12 may be in the range of from typically 1 μm to 250 μm, preferably from 5 μm to 200 μm, more preferably from 10 μm to 150 μm, and most preferably from 15 μm to 100 μm and may be appropriately determined according to the applications or the characteristics required for the electrode foil. If further reductions in the amount and weight are required, the upper limit of the thickness is preferably 50 μm, 35 μm, or 25 μm. If further strength is required, the lower limit of the thickness is preferably 25 μm, 35 μm, or 50 μm. A metal foil with such a thickness can be cut readily with a commercially available cutting machine. Unlike glass substrates, the metal foil 12 does not have disadvantages such as cracking and chipping, but has an advantage of not easily generating particulate matter during cutting. The metal foil 12 may be formed into various shapes, such as circle, triangle, and polygon, other than tetragon, and can also be cut and pasted to fabricate electronic devices with a three-dimensional shape, such as a cubic shape or a spherical shape since the metal foil can be cut and welded. In this case, it is preferred that a semiconductor functional layer be not formed at a cutting or welding portion of the metal foil 12.

The ultra-smooth surface 12a is preferably washed with an alkaline solution. A known alkaline solution, such as an ammonia-containing solution, a sodium hydroxide solution, and a potassium hydroxide solution can be used. The alkaline solution is preferably an ammonia-containing solution, more preferably an organic alkaline solution containing ammonia, most preferably a tetramethylammonium hydroxide (TMAH) solution. The preferred concentration of the TMAH solution ranges from 0.1 wt % to 3.0 wt %. An example of the washing described above involves washing at 23° C. for one minute with a 0.4% TMAH solution. A similar washing effect can also be attained by UV (Ultra Violet) treatment in combination with or in place of the washing with the alkaline solution. Furthermore, oxides formed on the surface of, for example, copper foil can be removed with an acidic cleaning liquid such as dilute sulfuric acid. An example of the acid washing involves washing for 30 seconds with dilute sulfuric acid.

Particles on the ultra-smooth surface 12a should preferably be removed. Examples of effective removal techniques of particles include sonic washing with ultra-pure water and dry-ice blasting. Dry-ice blasting is more effective. The dry-ice blasting involves ejecting highly compressed carbon dioxide gas through a fine nozzle and thereby squirting the ultra-smooth surface 12a with carbon dioxide solidified at low temperature to remove the particles. Unlike wet processes, the dry-ice blasting has advantages of no drying process and readily removable organic substances. The dry-ice blasting can be performed with a commercially available apparatus, such as a dry-ice snow system (manufactured by AIR WATER INC.). The particle removal step, however, may be omitted if particles have already been removed by the process for providing an ultra-smooth surface 12a with a Pv/Pp ratio of 2.0 or more (e.g., dry ice blasting).

Organic nitrogen compounds can be applied to the metal foil 12 in such a manner that the metal foil is treated with a solution containing an organic nitrogen compound through any conventional technique, for example, dip coating, spray coating, or roll coating, followed by drying the coating. If cleaning with the alkaline solution and/or removal of particles as described above is performed, the organic nitrogen compound may be applied after the completion of these steps. An intended CN/(CN+Cu) ratio due to the reduction in the organic nitrogen compound on the resultant metal foil surface can be achieved by immersing the metal foil in a cleaning liquid such as an alkaline (e.g. potassium hydroxide and/or sodium hydroxide) solution for an appropriately controlled immersion time, and preferably the concentration of the organic nitrogen compound solution is controlled to further adjust or reduce the remaining level of the organic nitrogen compound on the metal foil. For example, the BTA concentration in BTA coating solution is set to be as low as 0.5 mmol/L such that the BTA level on the surface of the metal foil is reduced to 0.4 or less (e.g., 0.2) in terms of the CN/(CN+Cu) ratio, and subsequently the metal foil is further immersed in 2 wt % NaOH/KOH solution. Thus, this process can reduce the BTA level down to 0.1 or less in terms of the CN/(CN+Cu) ratio.

The reflective layer 13 is preferably composed of at least one metal or alloy selected from the group consisting of aluminum, aluminum alloys, silver, and silver alloys. These materials are suitable for a reflective layer due to high optical reflectivity and thin films formed thereof also have excellent smoothness. In particular, inexpensive aluminum and aluminum alloys are preferred. Aluminum alloys and silver alloys with wide variety compositions conventionally used for an anode or a cathode of a light-emitting element and photoelectric element can be used. Preferred examples of the aluminum alloy compositions include Al—Ni; Al—Cu; Al—Ag; Al—Ce; Al—Zn; Al—B; Al—Ta; Al—Nd; Al—Si; Al—La; Al—Co; Al—Ge; Al—Fe; Al—Li; Al—Mg; and Al—Mn. Any element that constitutes these alloys may be combined thereof, depending on required characteristics. Preferred examples of the silver alloy compositions include Ag—Pd; Ag—Cu; Ag—Al; Ag—Zn; Ag—Mg; Ag—Mn; Ag—Cr; Ag—Ti; Ag—Ta; Ag—Co; Ag—Si; Ag—Ge; Ag—Li; Ag—B; Ag—Pt; Ag—Fe; Ag—Nd; Ag—La; and Ag—Ce. Any element that constitutes these alloys may be combined thereof, depending on required characteristics. The reflective layer 13 can have any thickness; and preferably has 30 nm to 500 nm, more preferably 50 nm to 300 nm, and most preferably 100 nm to 250 nm.

The buffer layer 14 may be provided on the outermost surface of the reflective layer 13. In the organic electroluminescent device, the buffer layer 14 can be any layer that can come into contact with an organic luminous layer to provide a desired work function. The buffer layer in the present invention is preferably transparent or translucent from the viewpoint of ensuring good efficacy of a light scattering effect The electrode foil of the present invention has a thickness of preferably from 1 μm to 300 μm, more preferably from 1 μm to 250 μm, still more preferably from 5 μm to 200 μm, particularly more preferably from 10 μm to 150 μm, most preferably from 15 μm to 100 μm. The thickness can be appropriately determined according to the applications or the characteristics required for the electrode foil. Accordingly, if further reduction in the amount of metal or in the weight of the foil is required, the upper limit of the thickness is particularly preferably 50 μm, 35 μm, or 25 μm. If further strength is required, the lower limit of the thickness is particularly preferably 25 μm, 35 μm, or 50 μm. These electrode foils each have a thickness substantially the same as that of the metal foil 12. This is because the thickness of the reflective layer 13 and/or the buffer layer 14 which may be formed on the metal foil 12 is negligibly small compared with the thickness of the metal foil 12.

The electrode foil of the present invention can be preferably used as an electrode (i.e., anode or cathode) for various electronic devices. The electrode foil of the present invention, which can be readily bent at low stress, is particularly preferably used as an electrode for flexible electronic devices, and it may also be used for less flexible or more rigid electronic devices. Examples of the electronic devices (mainly flexible electronic devices) include i) light-emitting elements (e.g., an organic EL element, an organic EL lighting device, an organic EL display and ii) photoelectric elements (e.g., a thin film solar cell); preferably an organic electroluminescent device such as an organic EL element, an organic EL lighting device, and an organic EL display; and more preferably an organic EL lighting device because it is significantly thin and emits light of high luminance.

The electrode foil of the present invention may have any length, and preferably should have a length enough to be applicable to a roll-to-roll process. The length of the electrode foil, which differs depending on the specifications of the device, is preferably at least about 2 m, and from the viewpoint of productivity, more preferably at least 20 m, still more preferably at least 50 m, particularly preferably at least 100 m, most preferably at least 1000 m. The width of the electrode foil which differs depending on the specifications of the device is preferably at least about 150 mm, and from the viewpoint of productivity, more preferably at least 350 mm, still more preferably at least 600 mm, particularly preferably at least 1000 m.

Organic Electroluminescent Device

An organic electroluminescent device having an organic emission layer on the outermost surface adjacent to the reflective layer of an electrode foil can be constructed using the electrode foil as an anode or a cathode. Thus, the organic emission layer is preferred to be formed directly on the reflective layer or, if present, directly on the buffer layer. The organic emission layer may be an organic semiconductor layer having a function of excitation light such as an organic EL layer of any material and structure. The organic light-emitting element is preferably further provided with a transparent or translucent counter electrode on the organic emission layer. The process of dissolving polymer materials and low molecular materials in such a solvent as chlorobenzene and applying the solution is preferably applicable to the process of forming the organic emission layer on the electrode foil of the invention, and an in-line vacuum process, which is suitable for improving productivity, is also applicable.

Figure 4:
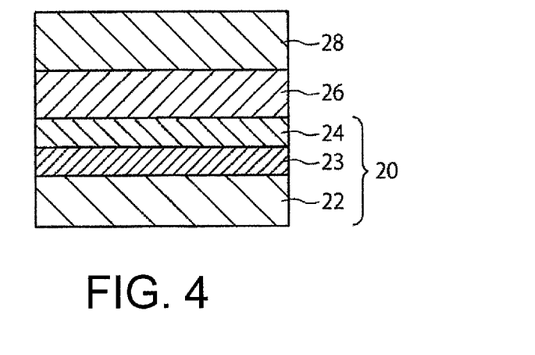
FIG. 4 is a schematic cross-sectional view illustrating an example of an organic EL element including an anode of the electrode foil of the present invention.

A light-emitting element and an organic EL lighting device which are provided with a top-emission organic EL element on the light scattering surface can be constructed with the electrode foil of the present invention as a reflective electrode. FIG. 4 shows an example layer structure of a top-emission organic EL element that includes the electrode foil of the present invention as an anode. The top-emission organic EL element depicted in FIG. 4 comprises an anodic electrode foil 20 comprising a metal foil 22, a reflective layer 23 and an optionally buffer layer 24; an organic EL layer 26 provided directly on the buffer layer 24; and a cathodes 28 as a light-transmitting electrode provided directly on the organic EL layer 26. The buffer layer 24 is preferably composed of a conductive amorphous carbon film or a conductive oxide film suitable for an anode.

The organic EL layer 26 may have various known EL layer structures used for organic EL elements and may comprise optionally a hole injection layer and/or a hole transport layer, a emission layer, and optionally an electron transport layer and/or an electron injection layer in this order from the anodic electrode foil 20 to the cathode 28. Any known structure or composition may be appropriately applied to each of the hole injection layer, the hole transport layer, the emission layer, the electron transport layer, and the electron injection layer, without any particular limitation.

The organic EL layer 26 may be prepared by any method selected from vacuum evaporation deposition, coating, printing, and a combination thereof. The emission layer may be composed of any material selected from low molecular organic materials, high molecular organic materials, metal oxides, and combinations thereof. Metal can be used for the hole injection layer or the electron injection layer. Either a highly rigid material such as glass or a flexible material such as a plastic film can be used for the upper base of the light extraction side.

EXAMPLES

The present invention will be further described in detail with reference to the following examples.

Example 1

Preparation of Electrode Foils Having Various Interfacial BTA Levels

Electrode foil samples 1 to 4 having various interfacial BTA levels were prepared as follows. Methods of measuring the arithmetic mean roughness Ra and the interfacial BTA level are described below.
(Measurement of Arithmetic Mean Roughness Ra)

Arithmetic mean roughness Ra values of the surfaces of the samples were measured with a Zygo NewView 5032 3-D Surface analyzer in accordance with JIS B0601-2001. The measurement was performed under the following conditions: Area: 181 μm×136 μm, Filter High: Auto, Filter Low: Fixed (150 μm).
(Measurement of Interfacial BTA Level)

The BTA level at the interface between the metal foil and the reflective layer (specifically the CN/(CN+Cu) ratio) was measured with a time-of-flight secondary ion mass spectrometer (TOF-SIMS) (TRIFT IV, manufactured by ULVAC-PHI, Inc.), by sputtering from the side of the reflective layer along the depth of the metal foil under the following conditions:
Primary ion: $Au^+$
Accelerating voltage: 30 kV
Measured area: square of 300 μm per side
Unit of measurement time: sec
Measured ion species: Positive/Negative
Electronic neutralization: Employed
(Sample 1: Comparison)

As metal foil, 65-μm thick commercially available both-side-flat electrolytic copper foil (DFF (Dual Flat Foil), manufactured by Mitsui Mining & Smelting Co., Ltd.) was prepared. The surface roughness of the copper foil was measured with a Zygo NewView 5032 3-D Surface analyzer in accordance with JIS B0601-2001. The arithmetic mean roughness Ra was 18.0 nm. Measurement was performed under the following conditions: Area: 181 μm×136 μm, Filter High: Auto, Filter Low: Fixed (150 μm).

The copper foil was polished with a commercially available polishing machine. This chemical-physical polishing treatment was performed with a polishing pad having XY grooves and a colloidal silica polishing solution under the conditions of a pad rotation speed of 30 rpm; a load of 200 gf/cm$^2$, and a liquid supply rate of 100 cc/min. The surface roughness of the CMP processed copper foil was measured with a Zygo NewView 5032 3-D Surface analyzer in accordance with JIS B0601-2001. The arithmetic mean roughness Ra was 1.5 nm. Measurement was performed under the conditions as follows: Area: 181 μm×136 μm, Filter High: Auto, Filter Low: Fixed (150 μm). The thickness of the copper foil after the CMP treatment was 60 μm.

Meanwhile, BTA (benzotriazole) as a corrosion inhibitor was added to a pure water (17.5 MΩ·cm or more) warmed at 35° C. to prepare a coating solution containing 25 mmol/L (about 3 g/L) of BTA. The BTA containing cleaning liquid was sprayed from the shower nozzle onto the copper foil under a pressure of 0.15 to 0.35 MPa, which was cleaned with pure water and then dried.

An Al alloy reflective layer with a thickness of 150 nm was deposited on the surface of the copper foil coated with BTA by sputtering. An aluminum alloy target (203.2 mm diameter and 8 mm thick) having a composition of Al-0.5Ni (at %) was placed in a magnetron sputtering apparatus (MSL-464, manufactured by Tokki Corp.) provided with a cryopump, and then the sputtering was performed under the conditions of an input power (DC) of 1,000 W (3.1 W/cm$^2$); an ultimate vacuum of lower than $5 \times 10^{-5}$ Pa; a sputtering pressure of 0.5 Pa; an Ar flow of 100 sccm; and a room substrate temperature. The surface mean roughness of the resulting sample was measured in the same manner as mentioned above. The arithmetic mean roughness Ra was 2.3 nm. The BTA level at the interface between the metal foil and the reflective layer was measured to be 0.96 in terms of the CN/(CN+Cu) ratio.
(Sample 2: Comparison)

Sample 2 was prepared and evaluated as in Sample 1 except that the BTA-coated copper foil prior to the formation of the reflective layer was immersed in a cleaning liquid containing 2 wt % NaOH/KOH for three minutes to elute the BTA. The surface roughness of the resulting sample was measured in the same manner as mentioned above. The arithmetic mean roughness Ra was 1.9 nm. The BTA level at the interface between the metal foil and the reflective layer was measured to be 0.57 in terms of the CN/(CN+Cu) ratio.
(Sample 3)

Sample 3 was prepared and evaluated as in Sample 1 except that the BTA concentration of the BTA coating solution is lowered to 0.4 mmol/L. The surface roughness of the resulting sample was measured in the same manner as mentioned above. The arithmetic mean roughness Ra was 2.0 nm. The BTA level at the interface between the metal foil and the reflective layer was measured to be 0.29 in terms of the CN/(CN+Cu) ratio.
(Sample 4)

Sample 4 was prepared and evaluated as in Sample 1 except that the BTA concentration of the BTA coating solution is lowered to 0.1 mmol/L, and the BTA-coated copper foil prior to formation of the reflective layer was immersed in a cleaning liquid containing 2 wt % NaOH/KOH for three minutes to elute the BTA. The surface roughness of the resulting sample was measured in the same manner as mentioned above. The arithmetic mean roughness Ra was 1.9 nm. The BTA level at the interface between the metal foil and the reflective layer was measured to be 0.04 in terms of the CN/(CN+Cu) ratio.

Example 2

Preparation and Evaluation of Organic Electroluminescent Device

1. Preparation of Organic Electroluminescent Device

The electrode foil samples 1 to 4 prepared in Example 1 each were used as an anode to prepare an organic electroluminescent device as follows. PEDOT: PSS (Clevios (trademark) P VP Al4083, manufactured by H.C. Starck Co., Ltd.) was coated on the electrode foil samples 1 to 4 into a thickness of about 65 nm, and was fired (annealed) at 200° C. for 15 min to form a hole injection layer. A solution of TFB (Poly[(9,9-dioctylfluorenyl-2,7-diyl)-co-(4,4'-(N-(4-sec-butylphenyl))diphenylamine)]) ("Hole Transport Polymer ADS259BE" manufactured by American Dye Source, Inc.) dissolved in a THF solvent was spin-coated on the hole injection layer to prepare a TFB coating having a thickness of 20 nm. The TFB coating was dried at 100° C. for 10 min to form an interlayer. A solution of a polymer electroluminescent material ("Light Emitting Polymer ADS111RE" manufactured by American Dye Source, Inc.) in a THF solvent was spin-coated on the interlayer, and was fired (annealed) at 100° C. for 10 min to form a light emission layer. Ba (manufactured by Kojundo Chemical Laboratory Co., Ltd) as an electron injecting layer was then deposited on the light emission layer into a thickness of 5 nm. Finally, Ag (manufactured by Kojundo Chemical Laboratory Co., Ltd) was deposited by a vacuum evaporation technique on the electron-injecting layer into a thickness of 20 nm to form a second electrode as a cathode.

2. Measurement of External Quantum Efficiency

External quantum efficiencies of the organic electroluminescent devices prepared above were measured as relative values to the efficiency (100%) of a glass substrate sample provided with aluminum deposited thereon. Specifically, a current with a density of 10 mA/cm$^2$ was applied through the electrodes in each organic electroluminescent device including the electrode foil sample. The luminance was measured at each angle from 0° (in the front face direction) to 80° with a luminance meter (BM-7A manufactured by Topcon Technohouse Corporation) and the total luminous fluxes were calculated to determine the external quantum efficiencies.

The results of the observed external quantum efficiencies of Samples 1 to 4 are given in Table 1, which demonstrates that an interfacial BTA concentration of 0.4 or less (preferably 0.3 or less) in terms of the CN/(CN+Cu) ratio can achieve an external quantum efficiency equal to or greater than the efficiencies of samples formed on a glass substrate.

[Table1]

TABLE 1

|  | Interfacial BTA concentration CN/(CN + Cu) ratio | External quantum efficiency (relative values to efficiency (100%) of glass substrate sample provided with Al deposited thereon) |
|---|---|---|
| Sample 1 (Comparative) | 0.96 | Unavailable element due to delamination of reflective layer |
| Sample 2 (Comparative) | 0.57 | 80% |
| Sample 3 | 0.29 | 100% |
| Sample 4 | 0.04 | 112% |

Example 3

Relationship Between Interfacial BTA Concentration and Time of Immersion

Figure 5:
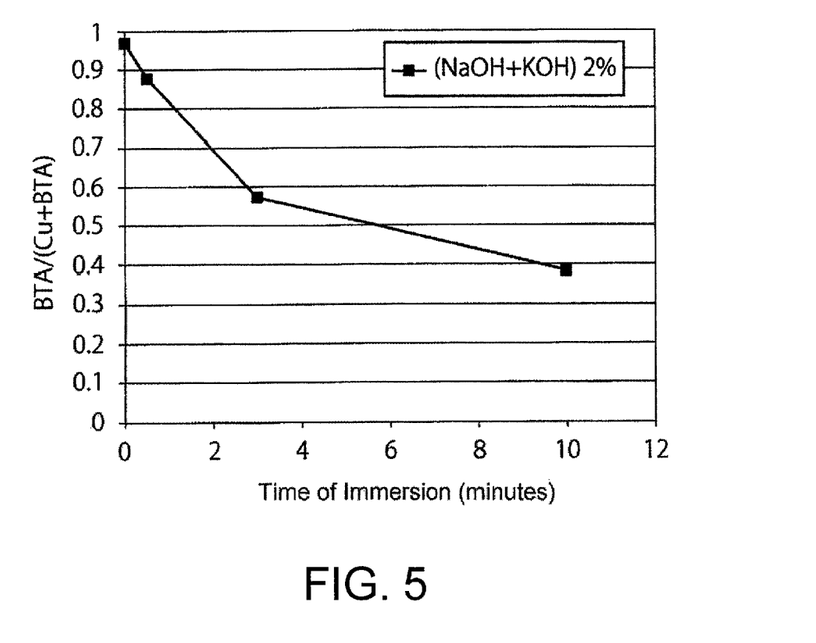
FIG. 5 is a graph showing the relationship between interfacial BTA level (ratio of CN to (CN+Cu)) and time of immersion in cleaning liquid in Example 3.

In the method of preparing Sample 2 in Example 1, the immersing time of the BTA-coated copper foil, on which the reflective layer was yet to be formed, in a cleaning liquid containing 2 wt % NaOH/KOH was varied from 0 min to 0.5 min, 3 min, and 10 min to evaluate changes in the CN/(CN+Cu) ratio corresponding to the BTA concentration. The results are given in FIG. 5. These results in FIG. 5 demonstrate that the control over the interfacial BTA concentration can be achieved by regulating the time of immersion. The remaining concentrations of tolyltriazole (TTA) or carboxybenzotriazole (C-BTA) as a corrosion inhibitor can also be controlled in the same manner.

Example 4

Figure 6:
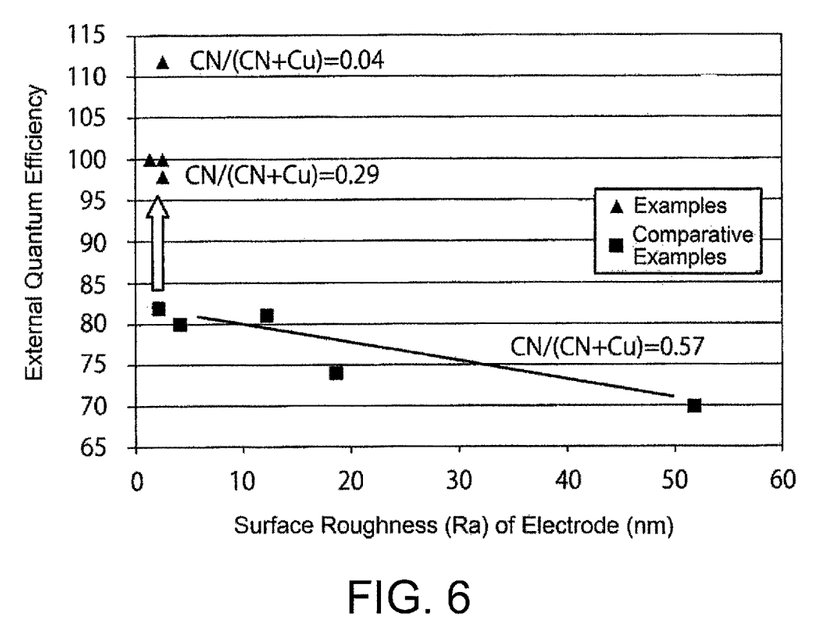
FIG. 6 is a graph showing the relationship between surface roughness Ra of electrode and external quantum efficiency of various samples prepared and evaluated in Example 4.

Evaluation of External Quantum Efficiencies at Various Ra Values and Various Interfacial BTA Concentrations Five electrode foils (CN/(CN+Cu)=0.57) having different arithmetic mean roughnesses Ra were prepared by modifying the polishing conditions in preparing Sample 2 of Example 1. The external quantum efficiencies of the resulting electrode foils were measured as in Example 2 to give the results in FIG. 6. For reference, the external quantum efficiencies measured for Sample 3 (CN/(CN+Cu)=0.29) and Sample 4 (CN/(CN+Cu)=0.04) are also plotted. The results shown in FIG. 6 demonstrates that the external quantum efficiencies are enhanced as the arithmetic mean roughness Ra decreases and that the reduced interfacial BTA levels (the CN/(CN+Cu) ratios), however, significantly enhance the external quantum efficiencies to such a degree more than predicted from the effect of reduced Ra (refer to the arrow in the figure).

The invention claimed is:

1. An electrode foil comprising a metal foil made of copper or copper alloy and a reflective layer provided on at least one surface of the metal foil; wherein an organic nitrogen compound is present at the interface between the metal foil and the reflective layer in such an amount that the ratio of the number of counts on the C—N bond to the total number of counts on the copper and the C—N bond: CN/(CN+Cu) in the organic nitrogen compound is 0.001 to 0.3 determined by time-of-flight secondary ion mass spectrometric analysis (TOF-SIMS) of the interface.

2. The electrode foil according to claim 1, wherein the organic nitrogen compound is selected from triazoles, and derivatives and isomers thereof.

3. The electrode foil according to claim 2, wherein the triazoles, and derivatives and isomers thereof are at least one compound selected from the group consisting of benzotriazole, benzotriazole derivatives, aminotriazole, aminotriazole isomers, and aminotriazole derivatives.

4. The electrode foil according to claim 1, wherein the outermost surface adjacent to the reflective layer of the electrode foil has an arithmetic mean roughness Ra of 60.0 nm or less measured in accordance with JIS B 0601-2001.

5. The electrode foil according to claim 4, wherein the arithmetic mean roughness Ra is 10 nm or less.

6. The electrode foil according to claim 1, wherein the electrode foil further comprises a transparent or translucent buffer layer provided directly on the surface of the reflective layer.

7. The electrode foil according to claim 1, wherein the electrode foil has a thickness of 1 to 250 μm.

8. The electrode foil according to claim 1, used as an electrode of an organic electroluminescent device.

9. The electrode foil according to claim 1, used as an electrode functioning as a supporting substrate for an organic electroluminescent device.

10. An organic electroluminescent device comprising the electrode foil of claim 1 and an organic emission layer provided on an outermost surface adjacent to the reflective layer of the electrode foil.

11. The organic electroluminescent device of claim 10, comprising a transparent or translucent counter electrode on the organic emission layer.

* * * * *